(12) United States Patent
Patil et al.

(10) Patent No.: US 11,749,611 B2
(45) Date of Patent: Sep. 5, 2023

(54) PACKAGE WITH A SUBSTRATE COMPRISING PERIPHERY INTERCONNECTS

(71) Applicant: QUALCOMM Incorporated, San Diego, CA (US)

(72) Inventors: Aniket Patil, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 63 days.

(21) Appl. No.: 17/164,723

(22) Filed: Feb. 1, 2021

(65) Prior Publication Data

US 2022/0246531 A1   Aug. 4, 2022

(51) Int. Cl.
*H01L 23/00* (2006.01)
*H01L 23/538* (2006.01)
*H01L 25/065* (2023.01)
*H01L 25/18* (2023.01)
*H01L 25/00* (2006.01)

(52) U.S. Cl.
CPC .......... *H01L 23/5386* (2013.01); *H01L 24/16* (2013.01); *H01L 25/0655* (2013.01); *H01L 25/18* (2013.01); *H01L 25/50* (2013.01); *H01L 2224/16227* (2013.01)

(58) Field of Classification Search
CPC ................................................. H01L 23/5386
See application file for complete search history.

(56) References Cited

U.S. PATENT DOCUMENTS

| | | | |
|---|---|---|---|
| 10,373,893 B2* | 8/2019 | Vaidya | H01L 23/5385 |
| 2008/0136011 A1 | 6/2008 | Shibata | |
| 2016/0240463 A1 | 8/2016 | Jow et al. | |
| 2020/0006371 A1* | 1/2020 | Huo | H01L 24/92 |
| 2020/0027509 A1* | 1/2020 | Chen | H01L 27/11575 |
| 2021/0296284 A1* | 9/2021 | Sharangpani | H01L 21/76804 |
| 2021/0366855 A1* | 11/2021 | Okina | H01L 24/06 |
| 2021/0375790 A1* | 12/2021 | Oda | H01L 24/05 |

FOREIGN PATENT DOCUMENTS

| | | |
|---|---|---|
| WO | 0203422 A2 | 1/2002 |
| WO | 2021207101 A2 | 10/2021 |

OTHER PUBLICATIONS

International Search Report and Written Opinion—PCT/US2021/064902—ISA/EPO—dated Apr. 12, 2022.

* cited by examiner

*Primary Examiner* — Thao P Le
(74) *Attorney, Agent, or Firm* — Loza & Loza, LLP

(57) ABSTRACT

A package comprising a substrate, a first integrated device and a second integrated device. The substrate includes at least one dielectric layer, a plurality of interconnects, a solder resist layer, and a plurality of periphery interconnects located over the solder resist layer. The first integrated device is coupled to the substrate. The second integrated device is coupled to the substrate. The second integrated device is configured to be electrically coupled to the first integrated device through the plurality of periphery interconnects.

23 Claims, 16 Drawing Sheets

AA CROSS SECTION

PROFILE VIEW

PLAN VIEW

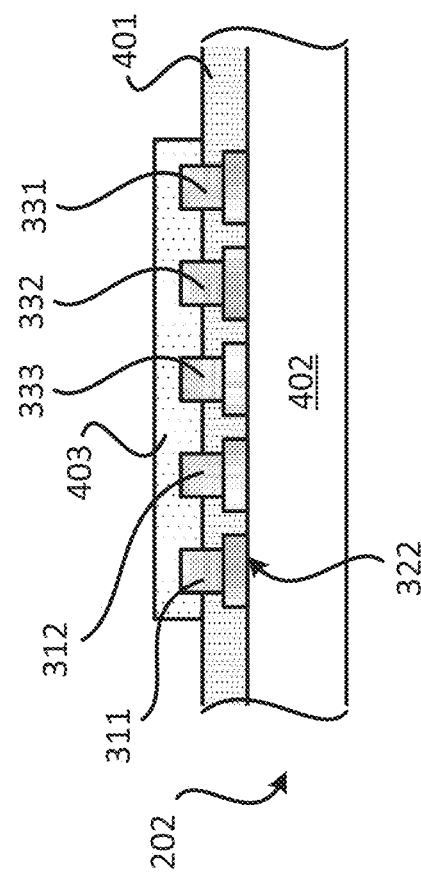
AA CROSS SECTION
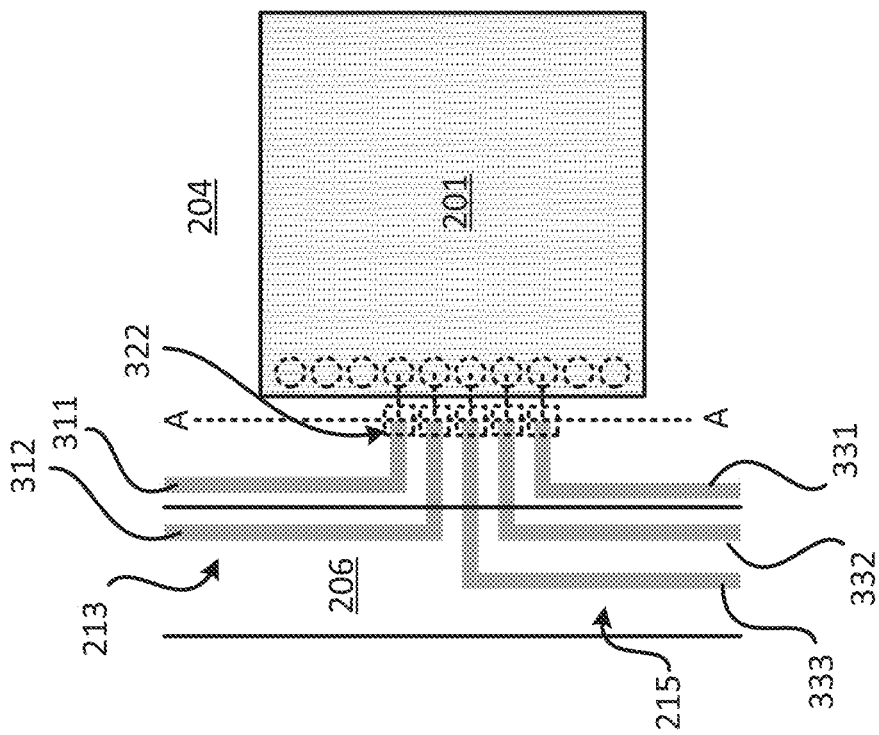
PLAN VIEW
FIG. 3
PROFILE VIEW
FIG. 4

PROFILE VIEW

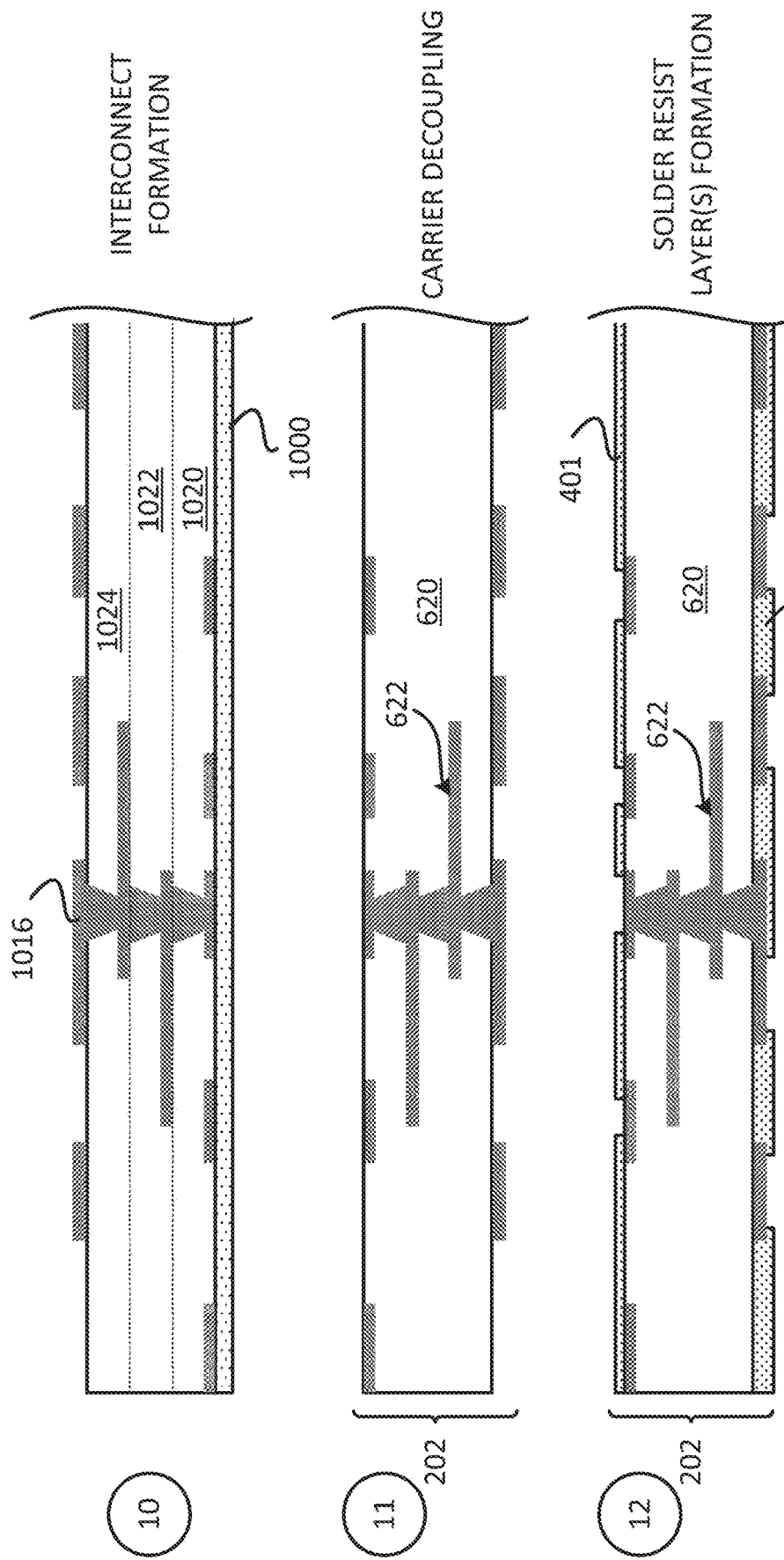

PACKAGE WITH A SUBSTRATE COMPRISING PERIPHERY INTERCONNECTS

FIELD

Various features relate to packages that include an integrated device, but more specifically to a package that includes an integrated device and a substrate.

BACKGROUND

FIG. 1 illustrates a package 100 that includes a substrate 102, an integrated device 104, and an integrated device 106. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. Electrically coupling the integrated device 104 and the integrated device 106 can adversely impact the overall performance of the package 100. There is an ongoing need to provide better performing packages.

SUMMARY

Various features relate to packages that include an integrated device, but more specifically to a package that includes an integrated device and a substrate.

One example provides a package comprising a substrate, a first integrated device and a second integrated device. The substrate includes at least one dielectric layer, a plurality of interconnects, a solder resist layer, and a plurality of periphery interconnects located over the solder resist layer. The first integrated device is coupled to the substrate. The second integrated device is coupled to the substrate. The second integrated devices is configured to be electrically coupled to the first integrated device through the plurality of periphery interconnects.

Another example provides an apparatus comprising a substrate, a first integrated device and a second integrated device. The substrate includes at least one dielectric layer, a plurality of interconnects, a solder resist layer, and means for periphery interconnection located over the solder resist layer. The first integrated device is coupled to the substrate. The second integrated device is coupled to the substrate. The second integrated devices is configured to be electrically coupled to the first integrated device through the means for periphery interconnection.

Another example provides a method for fabricating a package. The method provides a substrate comprising at least one dielectric layer, a plurality of interconnects, a solder resist layer and a plurality of periphery interconnects located over the solder resist layer. The method couples a first integrated device to the substrate. The method couples a second integrated device to the substrate. The second integrated devices are configured to be electrically coupled to the first integrated device through the plurality of periphery interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a plan view of a close view of an integrated device coupled to a substrate with periphery interconnects.

FIG. 4 illustrates a profile view of a substrate with periphery interconnects.

FIGS. 10A-10C illustrate an exemplary sequence for fabricating a substrate.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device and a second integrated device. The substrate includes at least one dielectric layer, a plurality of interconnects, a solder resist layer, and a plurality of periphery interconnects located over the solder resist layer. The first integrated device is coupled to the substrate. The second integrated device is coupled to the substrate. The second integrated devices is configured to be electrically coupled to the first integrated device through the plurality of periphery interconnects. The substrate includes a routing region and a keep out region. The plurality of periphery interconnects is located at least partially along a boundary of the routing region and the keep out region. The plurality of periphery interconnects is configured to provide at least one electrical path for at least one signal between the first integrated device and the second integrated device.

Exemplary Package Comprising a Substrate Comprising Periphery Interconnects

Figure 1:
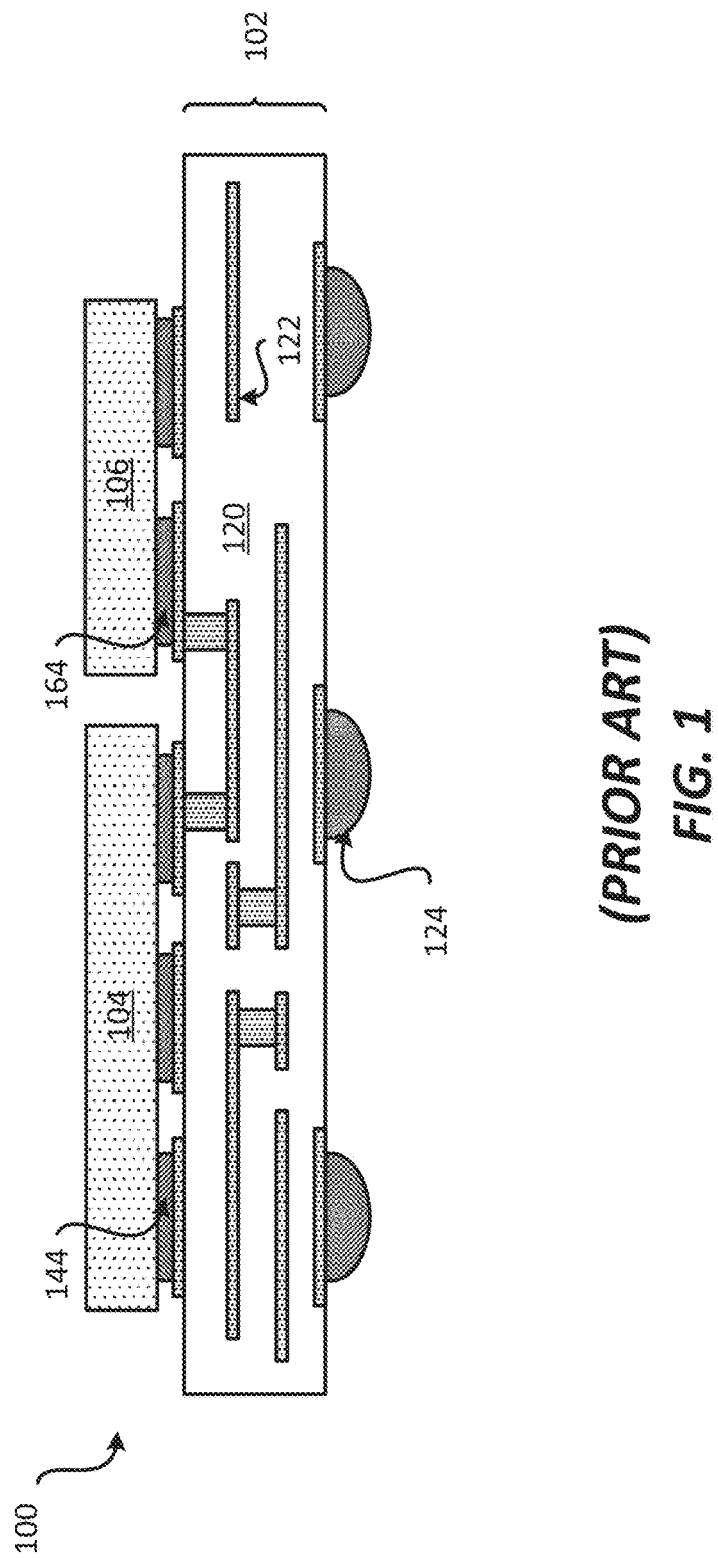
FIG. 1 illustrates a profile view of a package that includes integrated devices and a substrate.
Figure 2:
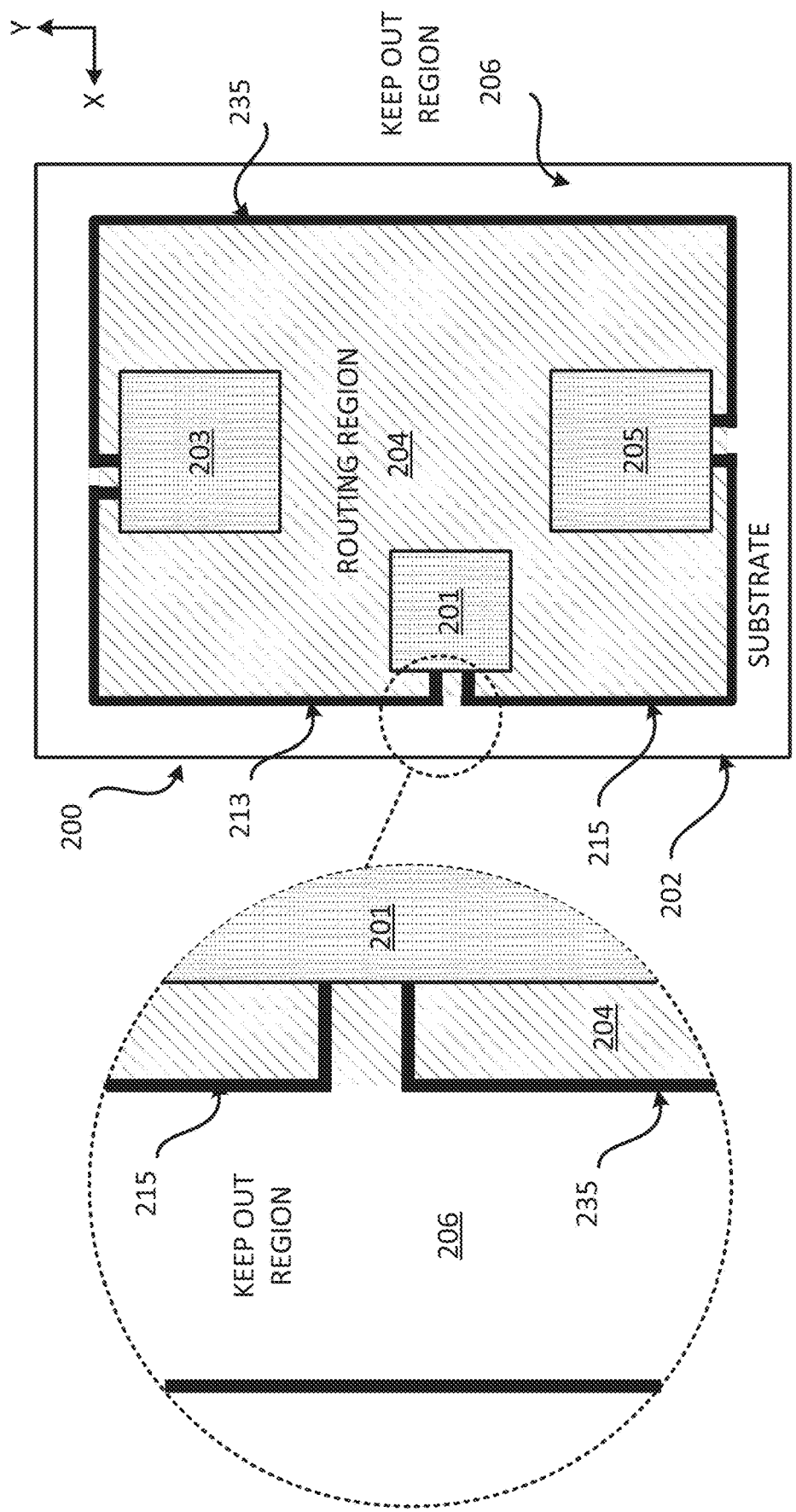
FIG. 2 illustrates a plan view of a package that includes a substrate with periphery interconnects.

FIG. 2 illustrates a plan view of a package 200 that includes a substrate with periphery interconnects. The package 200 includes a substrate 202, an integrated device 201, an integrated device 203 and an integrated device 205. The substrate 202 includes a routing region 204 and a keep out region 206. The integrated device 201, the integrated device 203 and the integrated device 205 are coupled to a first surface of the substrate 202. The integrated device 201, the integrated device 203 and the integrated device 205 are coupled to the routing region 204 of the substrate 202. The routing region 204 may include a region of the substrate 202 that includes interconnects in the substrate 202. The keep out region 206 may be free of interconnects in the substrate 202. The routing region 204 and the keep out region 206 share a boundary.

The substrate 202 includes a first plurality of periphery interconnects 213, a second plurality of periphery interconnects 215 and a third plurality of periphery interconnects 235. The first plurality of periphery interconnects 213, the second plurality of periphery interconnects 215 and/or the third plurality of periphery interconnects 235 may be located over a solder resist layer of the substrate 202. The first plurality of periphery interconnects 213 is configured to electrically couple the integrated device 201 and the integrated device 203. The second plurality of periphery interconnects 215 is configured to electrically couple the integrated device 201 and the integrated device 205. The third plurality of periphery interconnects 235 is configured to electrically couple the integrated device 203 and the integrated device 205.

The first plurality of periphery interconnects 213, the second plurality of periphery interconnects 215 and/or the third plurality of periphery interconnects 235 may be interconnects that are at least partially located along a boundary of the routing region 204 and the keep out region 206. The first plurality of periphery interconnects 213, the second plurality of periphery interconnects 215 and/or the third plurality of periphery interconnects 235 may be interconnects that are at least partially located along a periphery of the routing region 204. The first plurality of periphery interconnects 213, the second plurality of periphery interconnects 215 and/or the third plurality of periphery interconnects 235 may be interconnects that are at least partially located along an inner periphery of the keep out region 206. A periphery interconnect that is located along a boundary of the routing region 204 and the keep out region 206 may mean that the periphery is located at least partially on the boundary, on a portion of the routing region 204 that is adjacent to the boundary, and/or a portion of the keep out region 206 that adjacent to the boundary. The first plurality of periphery interconnects 213, the second plurality of periphery interconnects 215 and/or the third plurality of periphery interconnects 235 may be means for periphery interconnection.

A periphery interconnect may be configured as a channel (e.g., signal channel) between two integrated devices (e.g., two power management integrated circuit (PIMC)). The use of the first plurality of periphery interconnects 213, the second plurality of periphery interconnects 215 and/or the third plurality of periphery interconnects 235 along the periphery of the routing region 204 helps improve the performance of the power distribution network (PDN) of the package 200. For example, the first plurality of periphery interconnects 213, the second plurality of periphery interconnects 215 and/or the third plurality of periphery interconnects 235 may be located as far away as possible from the power rails and/or power planes (which may be located in the routing region 204 of the substrate 2020) of the package 200, which helps improve the performance of the power rails and/or power planes. Power rails and/or power planes are examples of interconnects that may be coupled to one or more integrated devices. Power rails and/or power planes may be located in a metal layer of the substrate 202. Moreover, positioning the periphery interconnects along a boundary and/or a periphery of the routing region 204 may help reduce the overall area of the metal layer that includes the periphery interconnects and/or reduce the number of metal layers of the substrate 202.

The first plurality of periphery interconnects 213, the second plurality of periphery interconnects 215 and/or the third plurality of periphery interconnects 235 may have a minimum line width (L) of 25 micrometers, and a minimum spacing (S) of 25 micrometers between periphery interconnects. The first plurality of periphery interconnects 213, the second plurality of periphery interconnects 215 and/or the third plurality of periphery interconnects 235 may have a minimum thickness of 18 micrometers.

The integrated device (e.g., 201, 203, 205) may include a die (e.g., semiconductor bare die). The integrated device may include a power management integrated circuit (PMIC). The integrated device may include an application processor. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 201, 203, 205) may include at least one electronic circuit (e.g., first electronic circuit, second electronic circuit, etc. . . . ).

The integrated devices (e.g., 201, 203, 205) are located over the routing region 204 of the substrate 202. It is noted that different packages may have different numbers of integrated devices. The located of the integrated devices is exemplary. The integrated devices may be coupled to different portions of the substrate.

FIG. 3 illustrates a close view of a plan view of the integrated device 201 and the substrate 202. As shown in FIG. 3, the first plurality of periphery interconnects 213 and the second plurality of periphery interconnects 215 are configured to be coupled (e.g., electrically coupled) to the integrated device 201. The first plurality of periphery interconnects 213 includes a periphery interconnect 311 and a periphery interconnect 312. The periphery interconnect 311 and the periphery interconnect 312 are configured to be coupled to the integrated device 201 and the integrated device 203. The periphery interconnect 311 and the periphery interconnect 312 are configured to provide electrical paths for signals between the integrated device 201 and the integrated device 203. As will be further described below, the first plurality of periphery interconnects 213 is coupled to the integrated device 201 through a plurality of interconnects, a plurality of solder interconnects and/or a plurality of pillar interconnects.

The periphery interconnect 311 is located in the routing region 204 and along a periphery of the routing region 204. The periphery interconnect 312 is located in the keep out region 206 and along an inner periphery of the keep out region 206. The first plurality of periphery interconnects 213 may extend along a boundary of the routing region 204 and the keep out region 206. A boundary of the routing region 204 and the keep out region 206 may include adjacent portions of the routing region 204 and/or adjacent portions of the keep out region 206 of the substrate 202.

The second plurality of periphery interconnects 215 includes a periphery interconnect 331, a periphery interconnect 332 and a periphery interconnect 333. The periphery interconnect 331, the periphery interconnect 332 and the periphery interconnect 333 are configured to be coupled to the integrated device 201 and the integrated device 205. The periphery interconnect 331, the periphery interconnect 332 and the periphery interconnect 33 are configured to provide electrical paths for signals between the integrated device 201 and the integrated device 205. As will be further described below, the second plurality of periphery interconnects 215 is coupled to the integrated device 201 through a plurality of interconnects, a plurality of solder interconnects and/or a plurality of pillar interconnects.

The periphery interconnect 331 is located in the routing region 204 and along a periphery of the routing region 204. The periphery interconnects 332 and 333 are located in the keep out region 206 and along an inner periphery of the keep out region 206. The second plurality of periphery interconnects 215 may extend along a boundary of the routing region 204 and the keep out region 206. A boundary of the routing region 204 and the keep out region 206 may include adjacent portions of the routing region 204 and/or adjacent portions of the keep out region 206 of the substrate 202.

Other integrated devices (e.g., 203, 205) may be coupled to their respective periphery interconnects in a similar manner as described for the integrated device 201. It is noted that different implementations may have different numbers of periphery interconnects that are coupled to an integrated device. Different implementations may position the periphery interconnects in different portions of the routing region 204 and/or the keep out region 206. Different implementations may define an adjacent portion of the routing region 204 differently. For example, an adjacent portion of the routing region 204 may include portions of the routing region 204 that is within 100 micrometers (e.g., 100 micrometers or less) of the boundary shared between the routing region 204 and the keep out region 206. Different implementations may use a value that is less than 100 micrometers to define an adjacent portion of the routing region 204 to the boundary.

FIG. 4 illustrates a profile view of the substrate 202 across the AA cross-section of FIG. 3. The substrate 202 includes at least one dielectric layer 402, a plurality of interconnects 322, a solder resist layer 401, the first plurality of periphery interconnects 213, the second plurality of periphery interconnects 215, and a periphery dielectric layer 403. Some of the interconnects (e.g., pads) from the plurality of interconnects 322 is located over a surface of the at least one dielectric layer 402. The solder resist layer 401 is located over the at least one dielectric layer 402 and the plurality of interconnects 322. The periphery interconnects 311, 312, 331, 332 and 333 are coupled to interconnects from the plurality of interconnects 322. The periphery dielectric layer 403 is located over the solder resist layer 401 and the periphery interconnects (e.g., 311, 312, 331, 332, 333). The plurality of interconnects 322 may be configured to be coupled to an integrated device (e.g., 201) through solder interconnects and/or pillar interconnects. The at least one dielectric layer 402 may include the at least one dielectric layer 620, as further described below.

Figure 5:
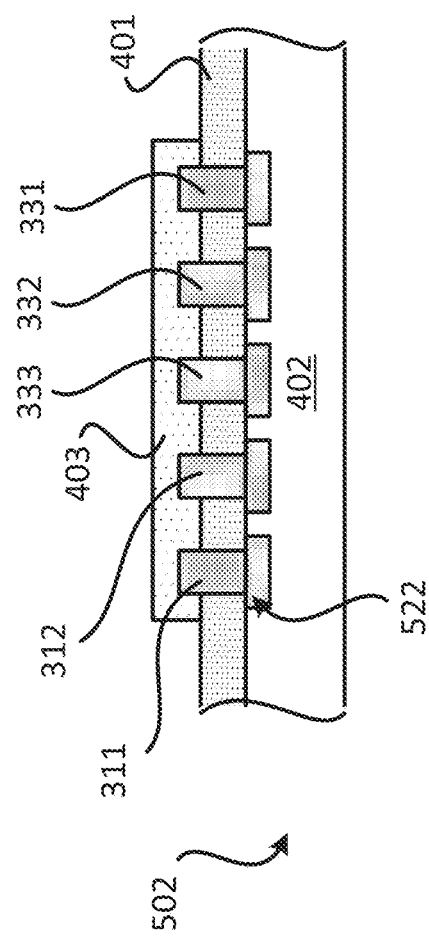
FIG. 5 illustrates a profile view of a substrate with periphery interconnects.

FIG. 5 illustrates a profile view of the substrate 502 across the AA cross-section of FIG. 3. The substrate 502 of FIG. 5 may be similar to the substrate 202. Thus, the substrate 502 may include the same or similar components as the substrate 202. The substrate 502 includes at least one dielectric layer 402, a plurality of interconnects 522, a solder resist layer 401, the first plurality of periphery interconnects 213, the second plurality of periphery interconnects 215, and a periphery dielectric layer 403. Some of the interconnects (e.g., pads) from the plurality of interconnects 522 is located in (e.g., embedded in) the at least one dielectric layer 402. The solder resist layer 401 is located over the at least one dielectric layer 402 and the plurality of interconnects 522. The periphery interconnects 311, 312, 331, 332 and 333 are coupled to interconnects from the plurality of interconnects 522. The periphery dielectric layer 403 is located over the solder resist layer 401 and the periphery interconnects (e.g., 311, 312, 331, 332, 333). The plurality of interconnects 522 may be configured to be coupled to an integrated device (e.g., 201) through solder interconnects and/or pillar interconnects. It is noted that the configuration shown in FIGS. 4 and 5 may be applicable to other integrated devices (e.g., 203, 205) described in the disclosure.

Figure 6:
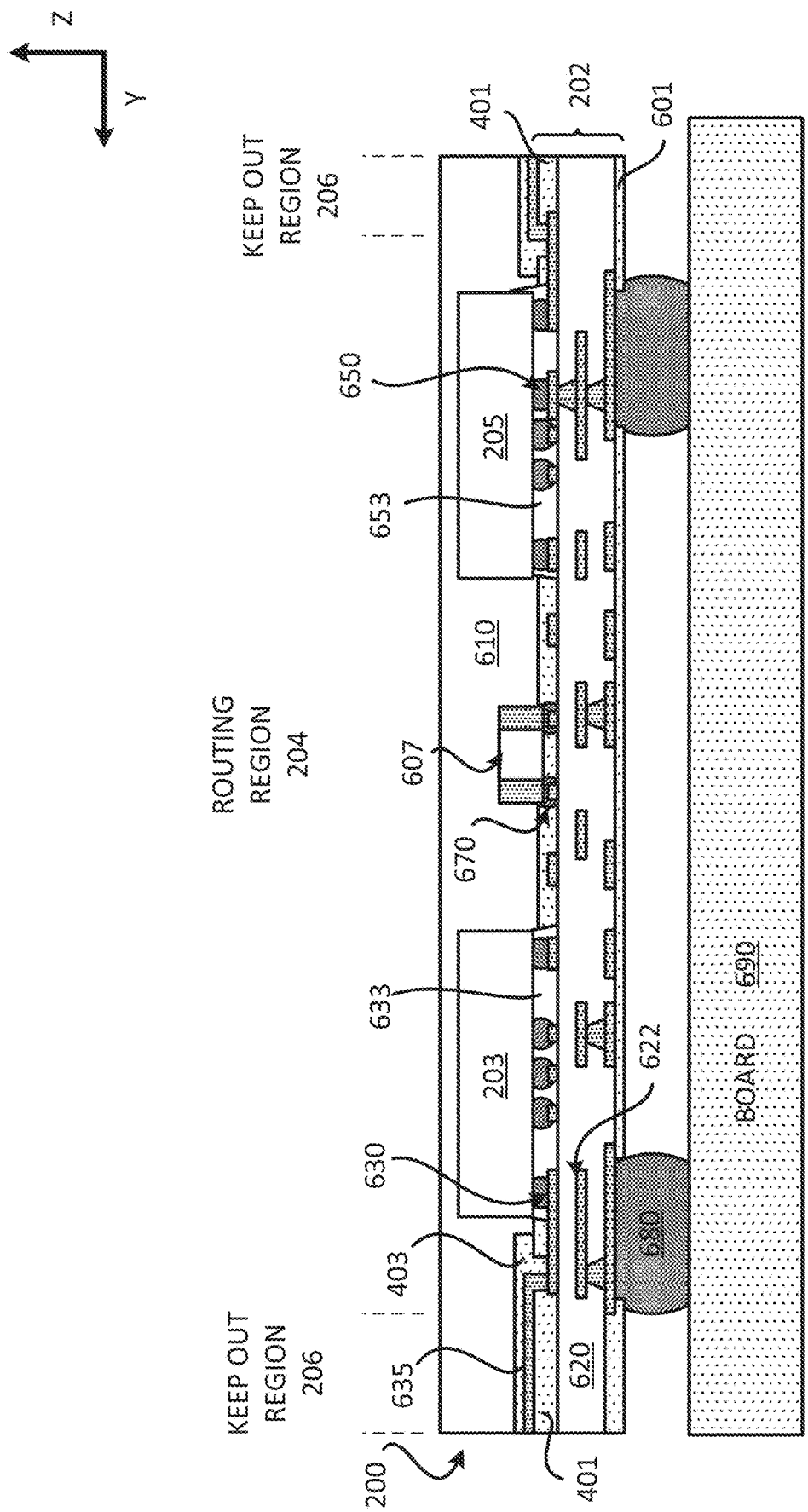
FIG. 6 illustrates a profile view of a package that includes a substrate with periphery interconnects.

FIG. 6 illustrates a profile view of a package 200 that includes a substrate 202 comprising periphery interconnects. The package 200 is coupled to a board 690 (e.g., printed circuit board (PCB)) through a plurality of solder interconnects 680. The package 200 provides a package with a compact small factor while also having optimized and improved PDN performance.

The package 200 includes the substrate 202, the integrated device 203, the integrated device 205, the component 607 (e.g., capacitor). The substrate 202 includes at least one dielectric layer 620, a plurality of interconnects 622, the solder resist layer 401, a solder resist layer 601, the plurality of periphery interconnects 625 and the periphery dielectric layer 403. The plurality of interconnects 622 may represent the plurality of interconnects 322 and/or the plurality of interconnects 522. Although not shown, the package 200 may include other integrated devices (e.g., 201) and other periphery interconnects (e.g., 213, 215). The plurality of interconnects 622 may include the plurality of interconnects 322.

The plurality of interconnects 622 may have a first minimum pitch and a first minimum line width (L) and spacing (S) (e.g., L/S). In some implementations, the first minimum line and spacing (L/S) for the plurality of interconnects 622 is in a range of approximately 9/9-12/12 micrometers (μm) (e.g., minimum line width of approximately 9-12 micrometers (μm), minimum spacing of approximately 9-12 micrometers (μm)).

The plurality of periphery interconnects 635 may have a minimum line width (L) of 25 micrometers, and a minimum spacing (S) of 25 micrometers between periphery interconnects. The plurality of periphery interconnects 635 may have a minimum thickness of 18 micrometers.

Figure 8:
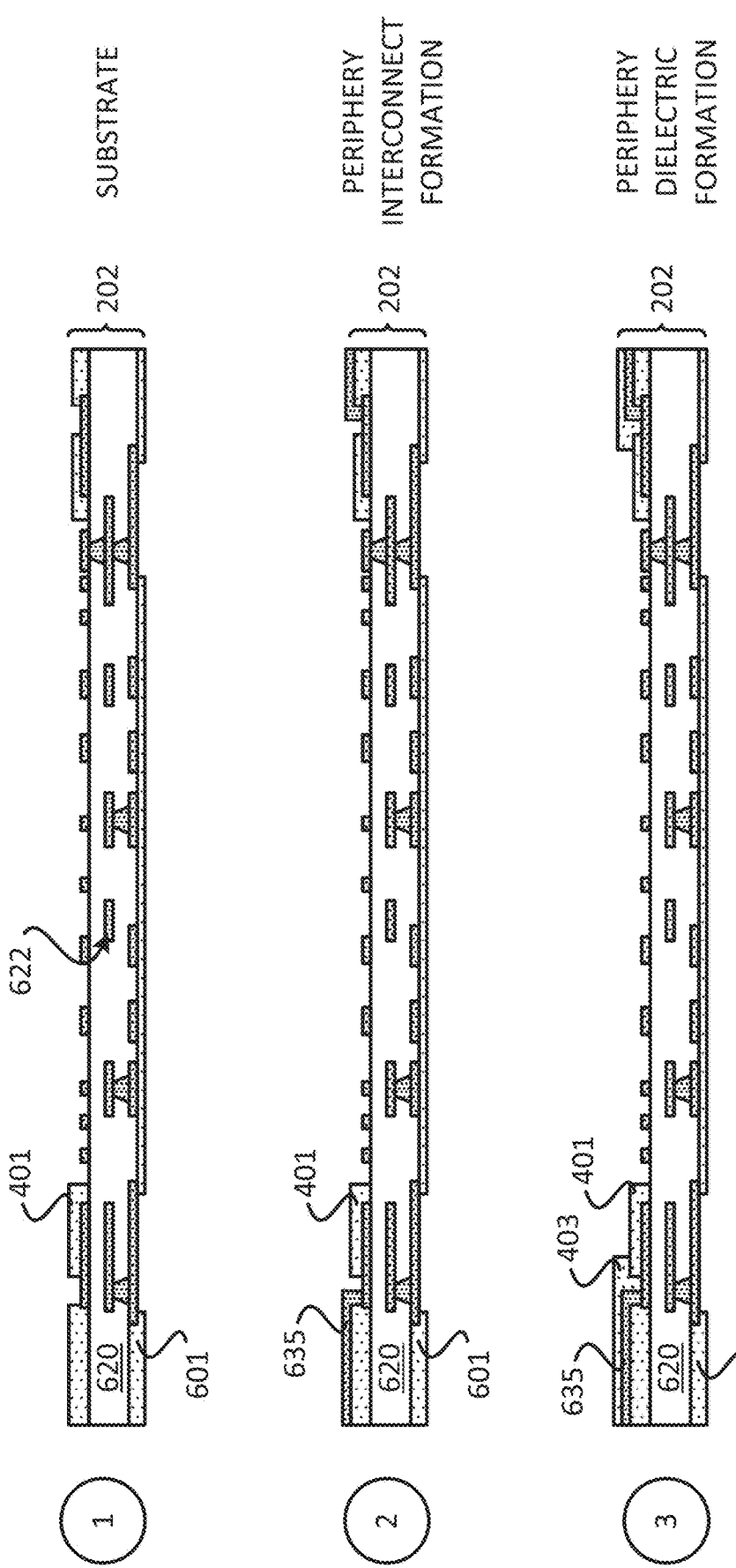
FIG. 8 illustrates an exemplary sequence for fabricating a substrate comprising periphery interconnects.

Different implementations may use different substrates. The substrate 202 may be a laminate substrate, a coreless substrate, an organic substrate, a substrate that includes a core layer (e.g., cored substrate). In some implementations, the at least one dielectric layer 620 may include a core layer and/or prepreg layers. The at least one dielectric layer 620 may have a dielectric constant in a range of approximately 3.5-3.7. The at least one dielectric layer 620 may include glass fabrics for reinforcing the substrate 202. An example of fabricating a substrate is further described below in FIGS. 10A-10C. As will be further described below, in some implementations, the substrate 202 may be fabricated using a modified semi-additive process (mSAP) or a semi-additive process (SAP). FIG. 8 illustrates and describes a sequence for fabricating a substrate comprising periphery interconnects.

The integrated device 203 is coupled to the first surface (e.g., top surface) of the substrate 202. The integrated device 203 is coupled to the substrate through a plurality of solder interconnects 630. The plurality of solder interconnects 630 may include pillar interconnects (e.g., copper pillars) and/or solder interconnects. An underfill 633 is located between the substrate 202 and the integrated device 203 (e.g., first integrated device). The underfill 633 may surround the plurality of solder interconnects 630. The integrated device 205 is coupled to the first surface (e.g., top surface) of the substrate 202. The integrated device 205 (e.g., second integrated device) is coupled to the substrate through a plurality of solder interconnects 650. The plurality of solder interconnects 650 may include pillar interconnects (e.g., copper pillars) and/or solder interconnects. An underfill 653 is located between the substrate 202 and the integrated device 205. The underfill 653 may surround the plurality of solder interconnects 350. The integrated device 203 and the integrated device 205 may be located over the routing region 204 of the substrate 202.

An encapsulation layer 610 may be formed over the substrate 202 and the integrated device(s) (e.g., 203, 205) and the component 607. The encapsulation layer 610 may include a mold, a resin and/or an epoxy. A compression molding process, a transfer molding process, or a liquid molding process may be used to form the encapsulation layer 610. The encapsulation layer 610 may be photo etchable. The encapsulation layer 610 may be a means for encapsulation.

The plurality of periphery interconnects 635 is located over the solder resist layer 401. The plurality of periphery interconnects 635 may represent any of the periphery interconnect (e.g., 213, 215, 235, 311, 312, 331, 332, 333) described in the disclosure. The plurality of periphery interconnects 635 may be located in an inner periphery of the keep out region 206, the periphery of the routing region 204, and/or along a boundary of the routing region 204 and the keep out region 206. The keep out region 206 may be free of interconnects in the substrate 202. For example, in the keep out region 206 of the substrate 202, there may not be an interconnect located in the at least one dielectric layer 620. In another example, in the keep out region 206 of the substrate 202, there may not be an interconnect located vertically between the solder resist layer 401 (e.g., bottom surface of the solder resist layer 401 coupled to the at least one dielectric layer 620) and the solder resist layer 601 (e.g., top surface of the solder resist layer 601 coupled to the at least one dielectric layer 620). The periphery dielectric layer 403 is located over the solder resist layer 401 and the plurality of periphery interconnects 635. The plurality of periphery interconnects 625 may be configured to electrically couple two or more integrated devices. The plurality of periphery interconnects 625 may be configured to as electrical path(s) for signals between two or more integrated devices.

The integrated device 203 is coupled to the plurality of periphery interconnects 635 through the plurality of solder interconnects 630 and interconnects (e.g., surface interconnects) from the plurality of interconnects 622. The integrated device 205 is coupled to the plurality of periphery interconnects 635 through the plurality of solder interconnects 650 and interconnects (e.g., surface interconnects) from the plurality of interconnects 622.

Figure 7:
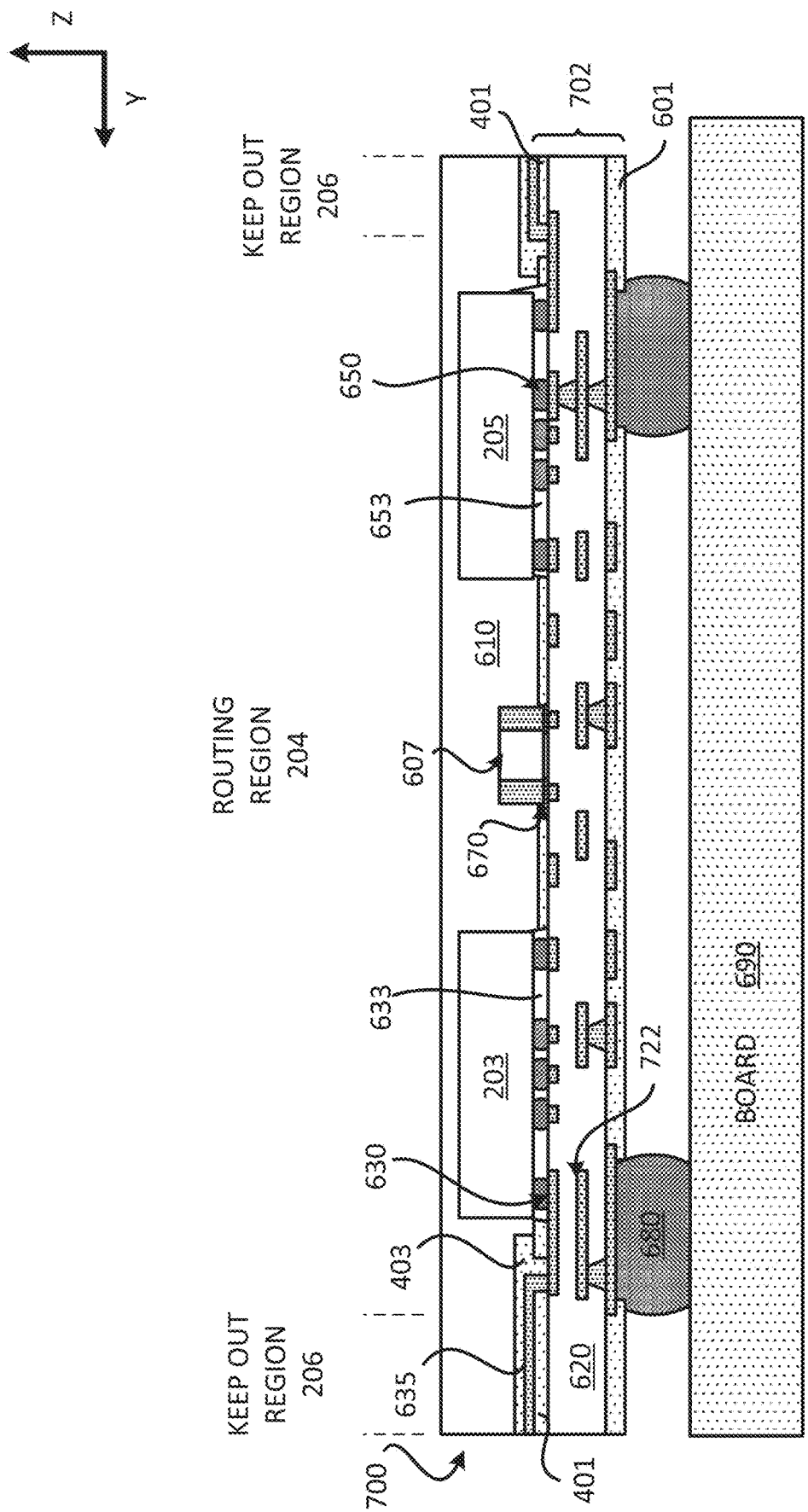
FIG. 7 illustrates a profile view of a package that includes a substrate with periphery interconnects.

FIG. 7 illustrates a profile view of a package 700 that includes a substrate 702 comprising periphery interconnects. The package 700 is similar to the package 200. As such, the package 700 includes the same or similar components as the package 200. The substrate 702 is similar to the substrate 202. As such, the substrate 702 includes the same or similar components as the substrate 202. The package 700 may represent the package 200 of FIGS. 1-5.

The substrate 702 includes at least one dielectric layer, a plurality of interconnects 722, the solder resist layer 401, the solder resist layer 601, the plurality of periphery interconnects 635 and the periphery dielectric layer 403. As shown in FIG. 7, the integrated device 203 and the integrated device 205 are coupled to embedded interconnects of the substrate 702.

The integrated device 203 is coupled to the plurality of periphery interconnects 635 through the plurality of solder interconnects 630 and interconnects (e.g., embedded interconnects) from the plurality of interconnects 622. The integrated device 205 is coupled to the plurality of periphery interconnects 635 through the plurality of solder interconnects 650 and interconnects (e.g., embedded interconnects) from the plurality of interconnects 622. The integrated device 203 and the integrated device 205 may be located over the routing region 204 of the substrate 702. As shown in FIGS. 6-7, the plurality of periphery interconnects 635 are located on different metal layers than the other interconnects of the substrate (e.g., 202, 702). For example, the plurality of periphery interconnects 635 is located on a different metal layer than interconnects that are located between the solder resist layer 401 and the solder resist layer 601.

Exemplary Sequence for Fabricating a Substrate Comprising Periphery Interconnects FIG. 8 illustrates an exemplary sequence for providing or fabricating a substrate comprising periphery interconnects. In some implementations, the sequence of FIG. 8 may be used to provide or fabricate the substrate 202 that includes periphery interconnects of FIG. 6, or any of the substrates described in the disclosure.

It should be noted that the sequence of FIG. 8 may combine one or more stages in order to simplify and/or clarify the sequence for providing or fabricating the substrate. In some implementations, the order of the processes may be changed or modified. In some implementations, one or more of processes may be replaced or substituted without departing from the scope of the disclosure. The sequence of FIG. 8 may be used to fabricate one substrate or several substrates at a time (as part of a wafer).

Stage 1, as shown in FIG. 8, illustrates a state after the substrate 202 is provided. The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 620, and a plurality of interconnects 622. The substrate 202 may be a laminate substrate, a coreless substrate, an organic substrate, a substrate that includes a core layer (e.g., cored substrate). In some implementations, the at least one dielectric layer 620 may include a core layer and/or prepreg layers. The substrate 202 includes at least one dielectric layer 620, a plurality of interconnects 622, a solder resist layer 401, and a solder resist layer 601.

Stage 2 illustrates a state after the plurality of periphery interconnects 635 is formed over the solder resist layer 401. The plurality of periphery interconnects 635 is coupled to the plurality of interconnects 622. The plurality of periphery interconnects 635 may be formed in cavities of the solder resist layer 401. The plurality of periphery interconnects 635 may represent one or more periphery interconnects from the plurality of periphery interconnects (e.g., 213, 215, 235, 311, 312, 331, 332, 333). Different implementations may form the plurality of periphery interconnects 635 differently. An inkjet and/or aerosol jet process may be used to form a conductive paste over the solder resist layer 401 and some portions of interconnects from the plurality of interconnects 622. The inkjet and/or aerosol jet process may form a conductive paste between two pads (e.g., surface pads, embedded pads).

Stage 3 illustrates a state after a periphery dielectric layer 403 is formed over the solder resist layer 401 and the plurality of periphery interconnects 635. The periphery dielectric layer 403 may also be formed in at least some of the cavities of the solder resist layer 401. Some of the periphery dielectric layer 403 may be located laterally between the solder resist layer 401 and the plurality of periphery interconnects 635. Different implementations may form the periphery dielectric layer 403 differently. An inkjet and/or aerosol jet process may be used to form a dielectric paste over the solder resist layer 401 and the plurality of periphery interconnects 635. Once the conductive paste and the dielectric paste are provided and/or formed, a curing process may be performed, which turns the conductive paste into the plurality of periphery interconnects 635 and the dielectric paste into the periphery dielectric layer 403. A curing process may include oven bake and/or ultraviolet (UV) cure.

Figure 9:
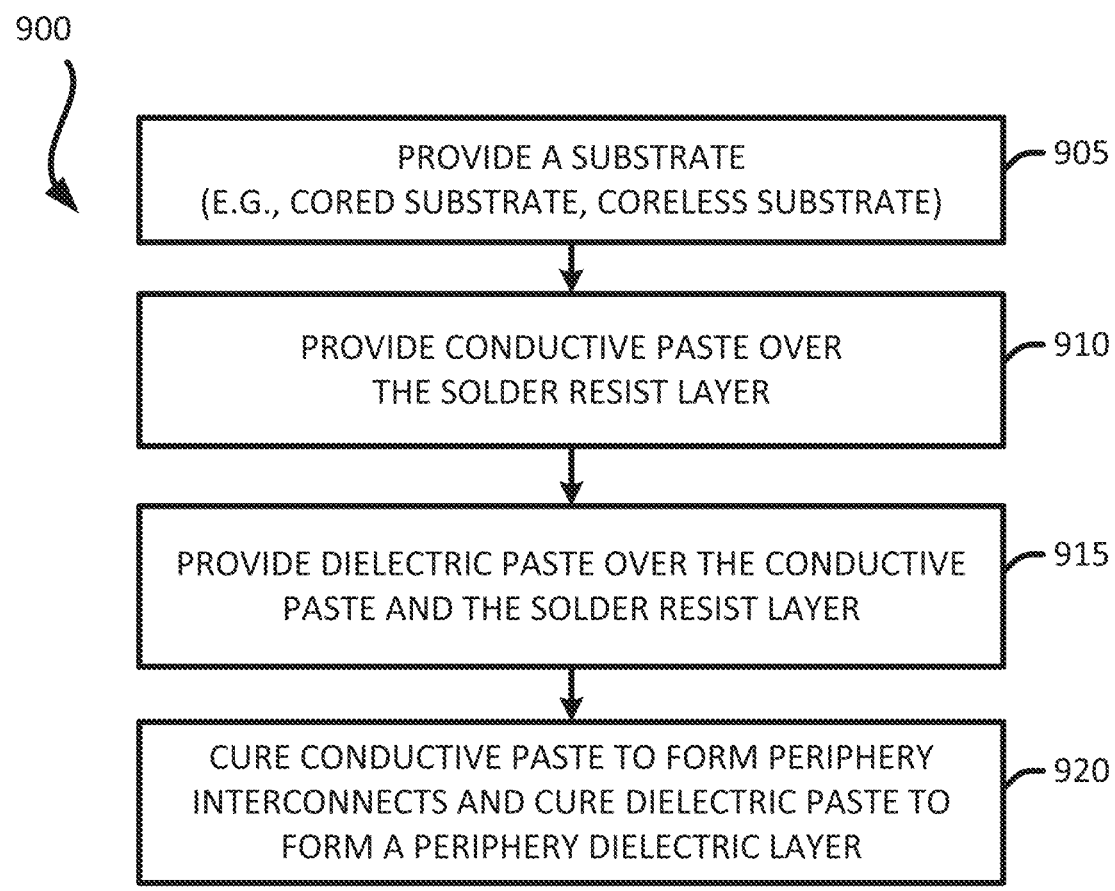
FIG. 9 illustrates an exemplary flow diagram of a method for fabricating a substrate comprising periphery interconnects.

Exemplary Flow Diagram of a Method for Fabricating a Substrate Comprising Periphery Interconnects In some implementations, fabricating a substrate that includes periphery interconnects includes several processes. FIG. 9 illustrates an exemplary flow diagram of a method 900 for providing or fabricating a substrate comprising periphery interconnects. In some implementations, the method 900 of FIG. 9 may be used to provide or fabricate the substrate (e.g., 202) of FIG. 6 described in the disclosure. However, the method 900 may be used to provide or fabricate any of the substrates described in the disclosure.

It should be noted that the method of FIG. 9 may combine one or more processes in order to simplify and/or clarify the method for providing or fabricating an interconnect device. In some implementations, the order of the processes may be changed or modified.

The method provides (at 905) a substrate (e.g., 202). The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 620, and a plurality of interconnects 622. The substrate 202 may be a laminate substrate, a coreless substrate, an organic substrate, a substrate that includes a core layer (e.g., cored substrate). In some implementations, the at least one dielectric layer 620 may include a core layer and/or prepreg layers. The substrate 202 includes at least one dielectric layer 620, a plurality of interconnects 622, a solder resist layer 401, and a solder resist layer 601.

The method provides (at 910) a conductive paste over the solder resist layer 401. The conductive paste may be coupled to the plurality of interconnects 622. The conductive paste may be formed in cavities of the solder resist layer 401. Once cured, the conductive paste may form the plurality of periphery interconnects 635. The plurality of periphery interconnects 635 may represent one or more periphery interconnects from the plurality of periphery interconnects (e.g., 213, 215, 235, 311, 312, 331, 332, 333). Different implementations may form the conductive paste differently. An inkjet and/or aerosol jet process may be used to form the conductive paste over the solder resist layer 401 and some portions of interconnects from the plurality of interconnects 622. The inkjet and/or aerosol jet process may form a conductive paste between two pads (e.g., surface pads, embedded pads). Stage 2 of FIG. 8, illustrates and describes an example of a conductive paste (which will become a periphery interconnect) that is formed over a solder resist layer.

The method provides (at 915) a dielectric paste over the solder resist layer 401 and the conductive paste. The dielectric paste may be formed in at least some of the cavities of the solder resist layer 401. Some of the dielectric paste may be located laterally between the solder resist layer 401 and the conductive paste. Once cured, the dielectric paste may form the periphery dielectric layer 403. Different implementations may form the dielectric paste differently. An inkjet and/or aerosol jet process may be used to form the dielectric paste over the solder resist layer 401 and the conductive paste. Stage 3 of FIG. 8, illustrates and describes an example of a dielectric paste (which will become a periphery dielectric layer) that is formed over a solder resist layer.

The method cures (at 920) the conductive paste and/or the dielectric paste. A curing process may include oven bake and/or ultraviolet (UV) cure. Curing the conductive paste may form the plurality of periphery interconnects 635. Curing the dielectric paste may form the periphery dielectric layer 403. The curing of the conductive paste and the dielectric paste may be performed concurrently or sequential.

Exemplary Sequence for Fabricating a Substrate

Figure 10A:
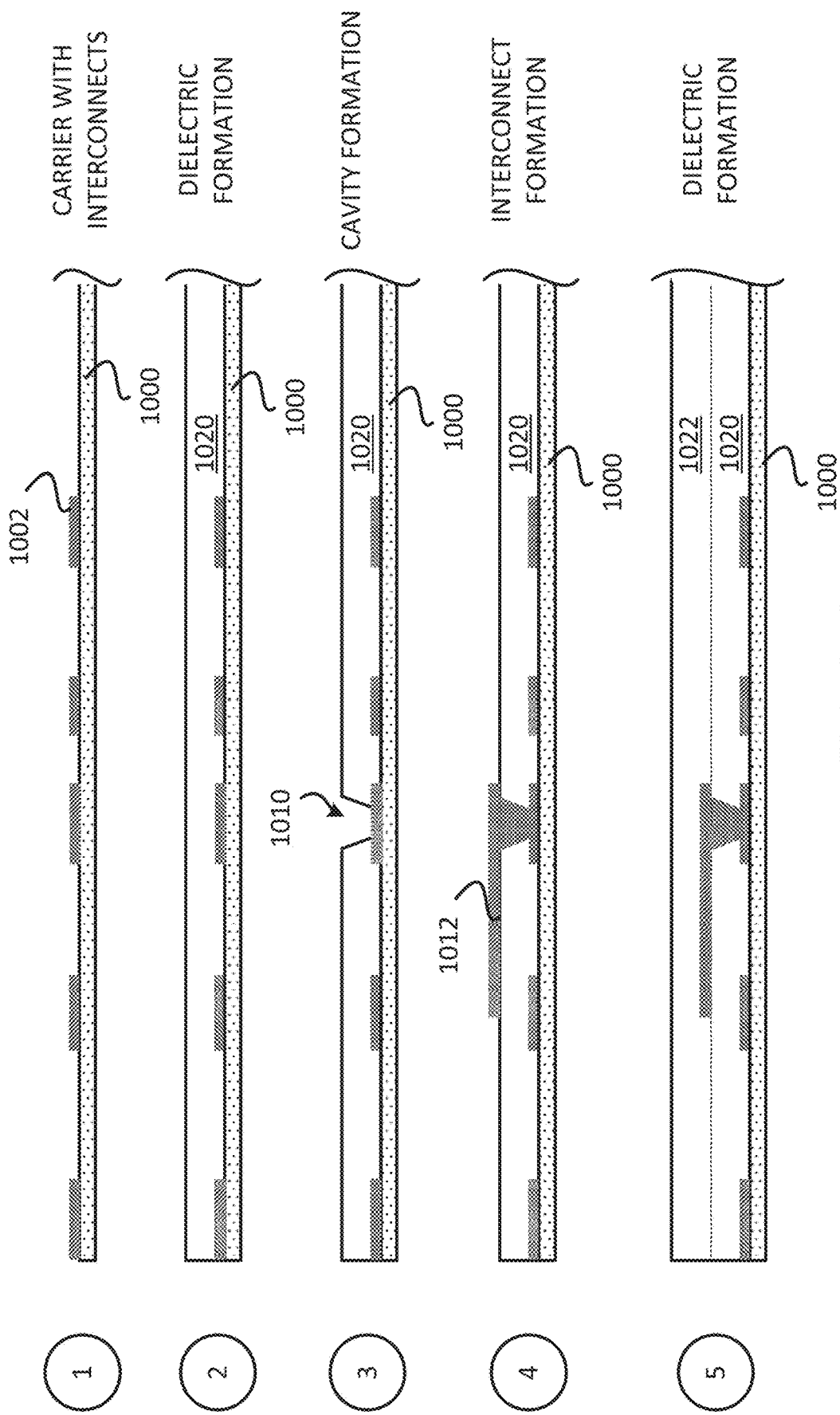
Figure 10B:
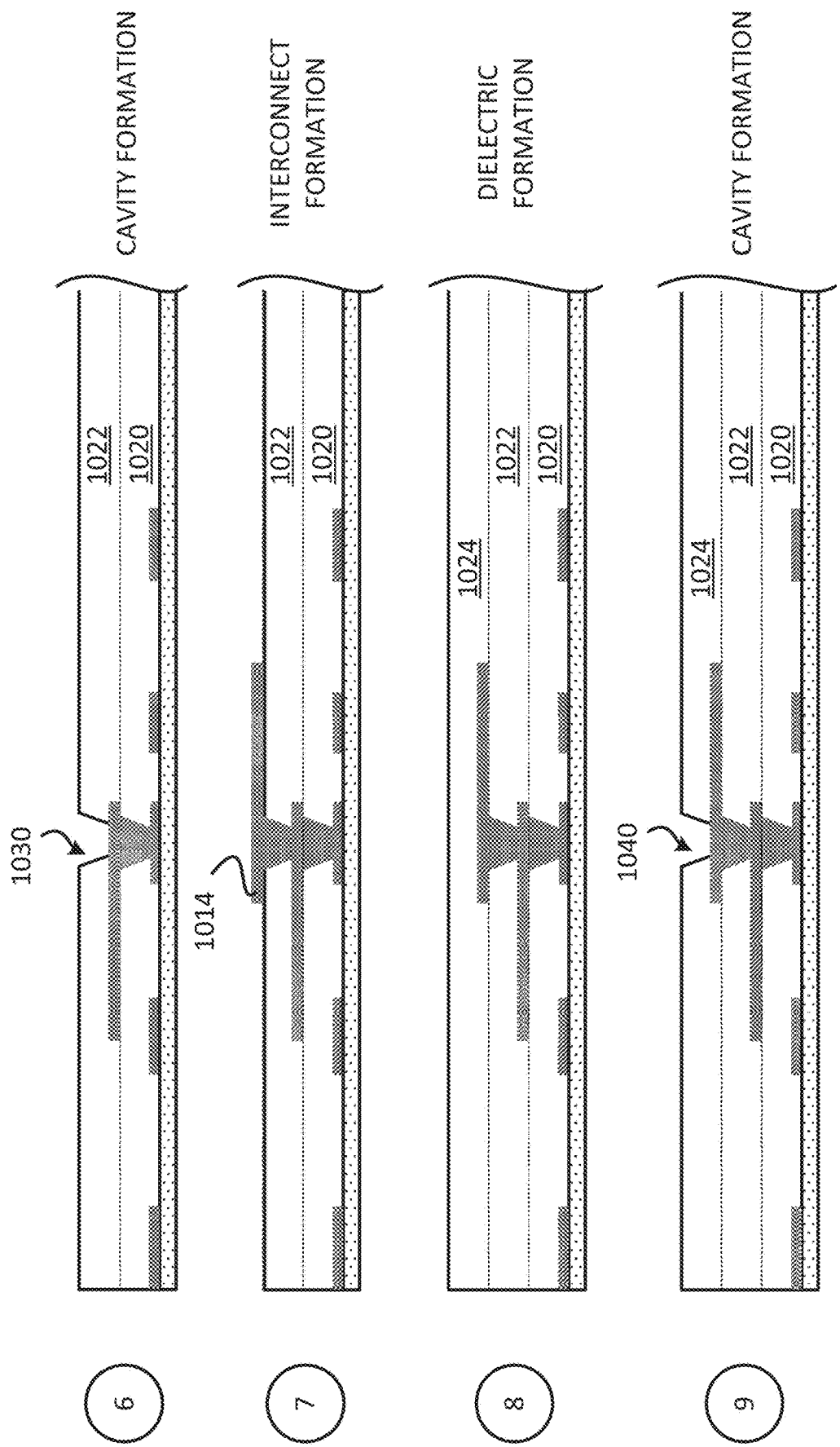

In some implementations, fabricating a substrate includes several processes. FIGS. 10A-10C illustrate an exemplary sequence for providing or fabricating a substrate. In some implementations, the sequence of FIGS. 10A-10C may be used to provide or fabricate the substrate 202 of FIG. 6. However, the process of FIGS. 10A-10C may be used to fabricate any of the substrates described in the disclosure.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Stage 10, as shown in FIG. 10C, illustrates a state after interconnects 1016 are formed in and over the dielectric layer 1024. For example, via, pad and/or trace may be formed. A plating process may be used to form the interconnects.

Some or all of the interconnects 1002, 1012, 1014 and/or 1016 may define the plurality of interconnects 622 of the substrate 202. The dielectric layers 1020, 1022, 1024 may be represented by the at least one dielectric layer 620.

Stage 11 illustrates a state after the carrier 1000 is decoupled (e.g., removed, grinded out) from the dielectric layer 620, leaving the substrate 202.

Stage 12 illustrates a state after the solder resist layer 401 and the solder resist layer 601 are formed over the substrate 202. The solder resist layer 401 and the solder resist layer 601 may be part of the substrate 202.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
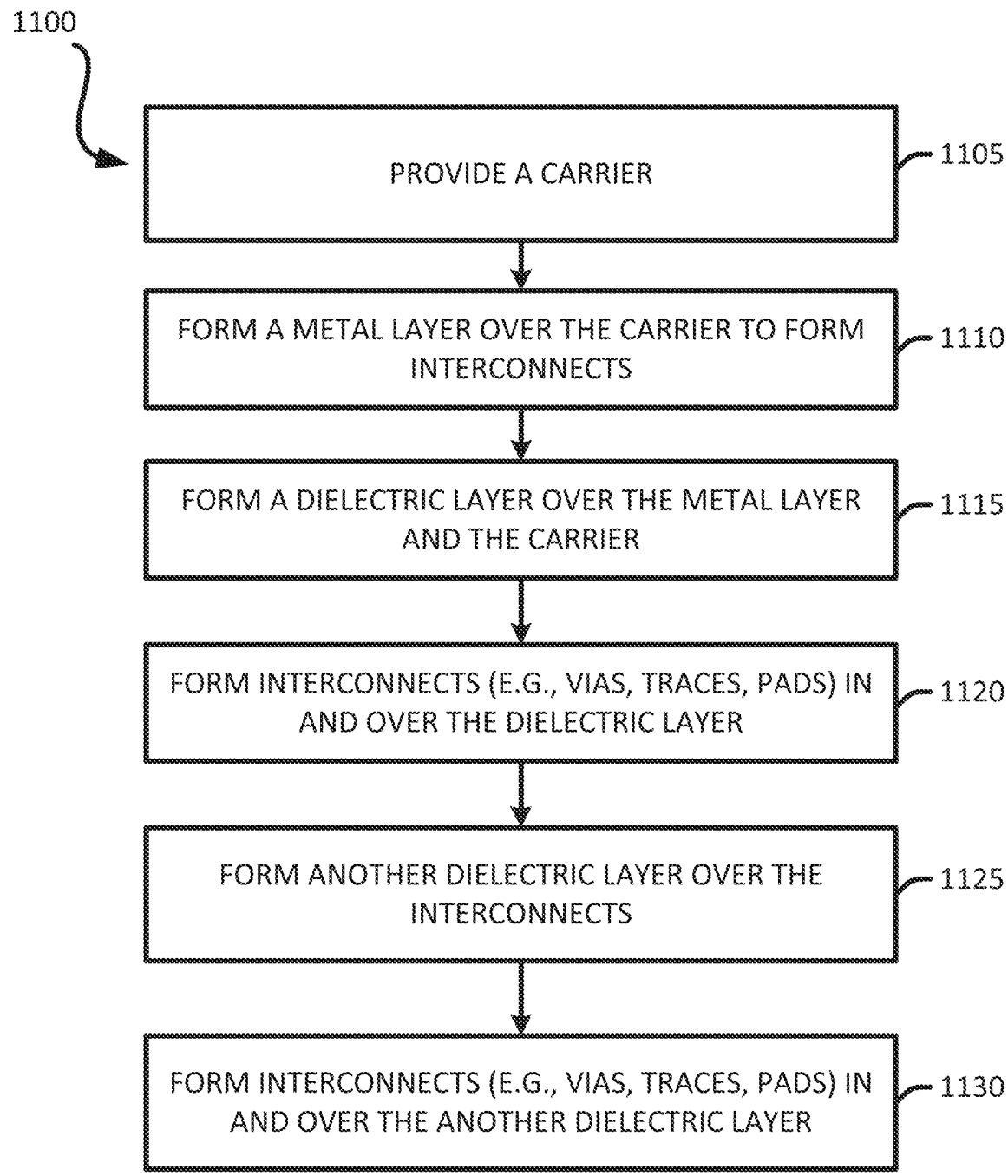
FIG. 11 illustrates an exemplary flow diagram of a method for fabricating a substrate.

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 6. For example, the method of FIG. 11 may be used to fabricate the substrate 202. The method of FIG. 11 may be used to fabricate the interconnect device, when the interconnect device is implemented as substrate and/or interposer.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates and describes an example of a state after a carrier is provided.

The method forms (at 1110) a metal layer over the carrier 1000. The metal layer may be patterned to form interconnects. A plating process may be used to form the metal layer and interconnects. Stage 1 of FIG. 10A illustrates and describes an example of a state after a metal layer and interconnects 1002 are formed.

The method forms (at 1115) a dielectric layer 1020 over the carrier 1000 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching) or laser process. Stages 2-3 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 4 of FIG. 10A illustrates and describes an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 5-6 of FIGS. 10A-10B illustrate forming a dielectric layer and cavities in the dielectric layer.

The method forms (at 1130) interconnects in and/or over the dielectric layer. For example, the interconnects 1014 may be formed. A plating process may be used to form the interconnects. Forming interconnects may include providing a patterned metal layer over an in the dielectric layer. Stage 7 of FIG. 10B illustrates and describes an example of forming interconnects in and over a dielectric layer.

The method may form additional dielectric layer(s) and additional interconnects as described at 1125 and 1130. Stages 8-10 of FIGS. 10B-10C illustrate and describe an example of forming additional interconnects in and over a dielectric layer.

Once all the dielectric layer(s) and additional interconnects are formed, the method may decouple (e.g., remove, grind out) the carrier (e.g., 1000) from the dielectric layer 1020, leaving the substrate. In some implementations, the method may form solder resist layers (e.g., 401, 601) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12A:
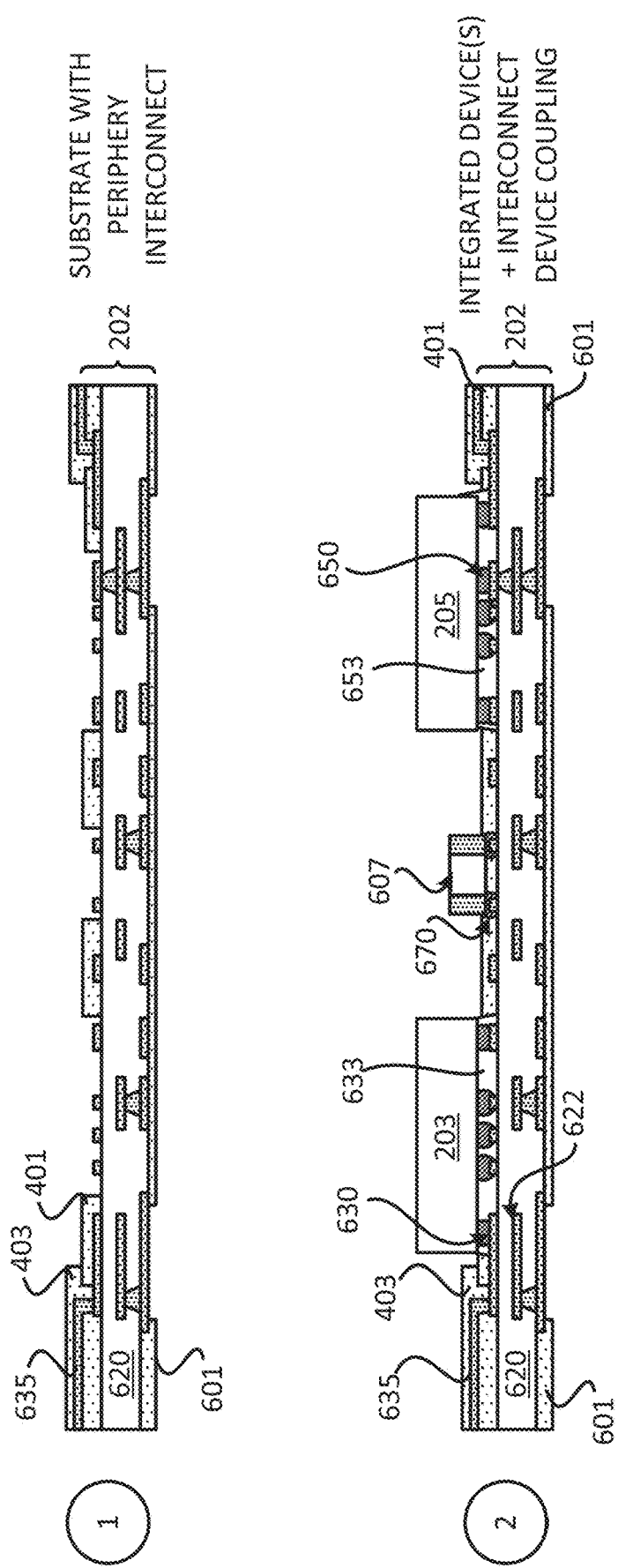
FIGS. 12A-12B illustrate an exemplary sequence for fabricating a package that includes a substrate comprising periphery interconnects.
Figure 12B:
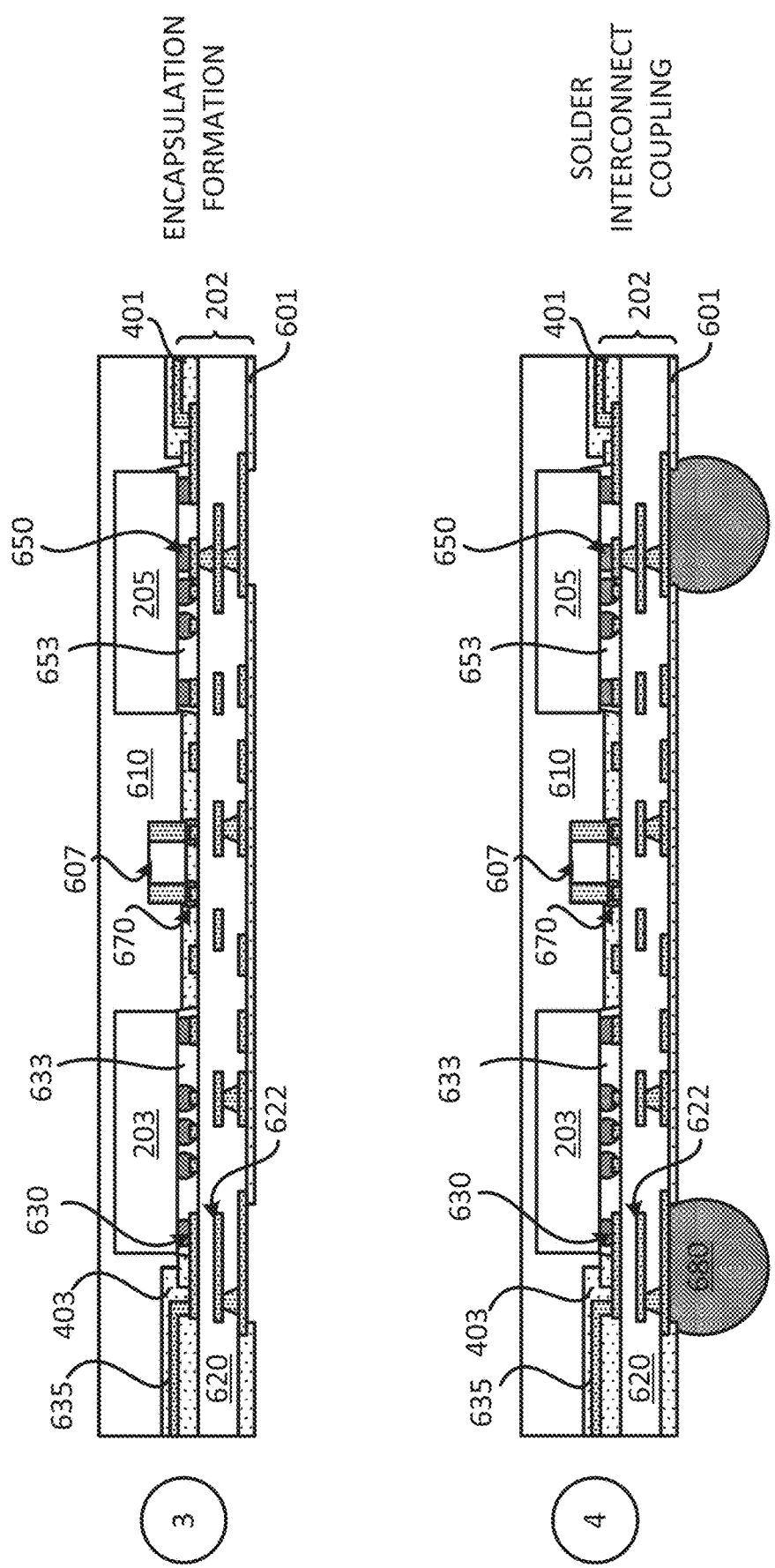

Exemplary Sequence for Fabricating a Package that Includes a Substrate Comprising Periphery Interconnects FIGS. 12A-12B illustrate an exemplary sequence for providing or fabricating a package that includes a substrate comprising periphery interconnects. In some implementations, the sequence of FIGS. 12A-12B may be used to provide or fabricate the package 200 that includes a substrate comprising periphery interconnects of FIG. 6, or any of the packages described in the disclosure.

It should be noted that the sequence of FIGS. 12A-12B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 12A-12B may be used to fabricate one package or several packages at a time (as part of a wafer).

Stage 1, as shown in FIG. 12A, illustrates a state after the substrate 202 is provided. The substrate 202 may be provided by a supplier or fabricated. A process similar to the process shown in FIGS. 8 and 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 620, and a plurality of interconnects 622. The substrate 202 may be a laminate substrate, a coreless substrate, an organic substrate, a substrate that includes a core layer (e.g., cored substrate). In some implementations, the at least one dielectric layer 620 may include a core layer and/or prepreg layers. The substrate 202 includes at least one dielectric layer 620, a plurality of interconnects 622, a solder resist layer 401, a solder resist layer 601, a plurality of periphery interconnects 635, and a periphery dielectric layer 403.

Stage 2 illustrates a state after the integrated device 203, the integrated device 205 and the component 607 are coupled to a first surface (e.g., top surface) of the substrate 202. The integrated device 203 may be coupled to the substrate 202 through a plurality of solder interconnects 630. The integrated device 205 may be coupled to the substrate 202 through a plurality of solder interconnects 650. The component 607 may be coupled to the substrate 202 through a plurality of solder interconnects 670. Other integrated devices (e.g., 201) may be coupled to the substrate 202. The integrated device 203 and the integrated device 205 may be coupled to the substrate 202 such that the integrated device 203 and the integrated device 205 are configured to be electrically coupled to each other through the plurality of periphery interconnects 635. The plurality of periphery interconnects 635 may be located at least partially along a boundary of the routing region 204 and the keep out region 206 of the substrate 202. The integrated device 203, the integrated device 205 and the component 607 may be coupled to the substrate 202 such that the integrated device 203, the integrated device 205 and the component 607 are located over the routing region 204 of the substrate 202.

Stage 3, as shown in FIG. 12B, illustrates a state after an encapsulation layer is provided over the substrate 202 and the integrated devices. The encapsulation layer may encapsulate the integrated devices(s) and/or the components. For example, an encapsulation layer 610 may be formed over the substrate 202 and the integrated device(s) (e.g., 203, 205). The encapsulation layer 610 may include a mold, a resin and/or an epoxy. A compression molding process, a transfer molding process, or a liquid molding process may be used to form the encapsulation layer 610. The encapsulation layer 610 may be photo etchable. The encapsulation layer 610 may be a means for encapsulation.

Stage 4 illustrates a state after the plurality of solder interconnects 680 is coupled to the second surface (e.g., bottom surface) of the substrate 202. The plurality of solder interconnects 680 may be coupled to interconnects from the plurality of interconnects 622 of the substrate 202. A solder reflow process may be used to couple the plurality of solder interconnects 680 to the substrate 202. Stage 4 may illustrate the package 600. The packages (e.g., 600,) described in the disclosure may be fabricated one at a time or may be fabricated together as part of one or more wafers and then singulated into individual packages.

Figure 13:
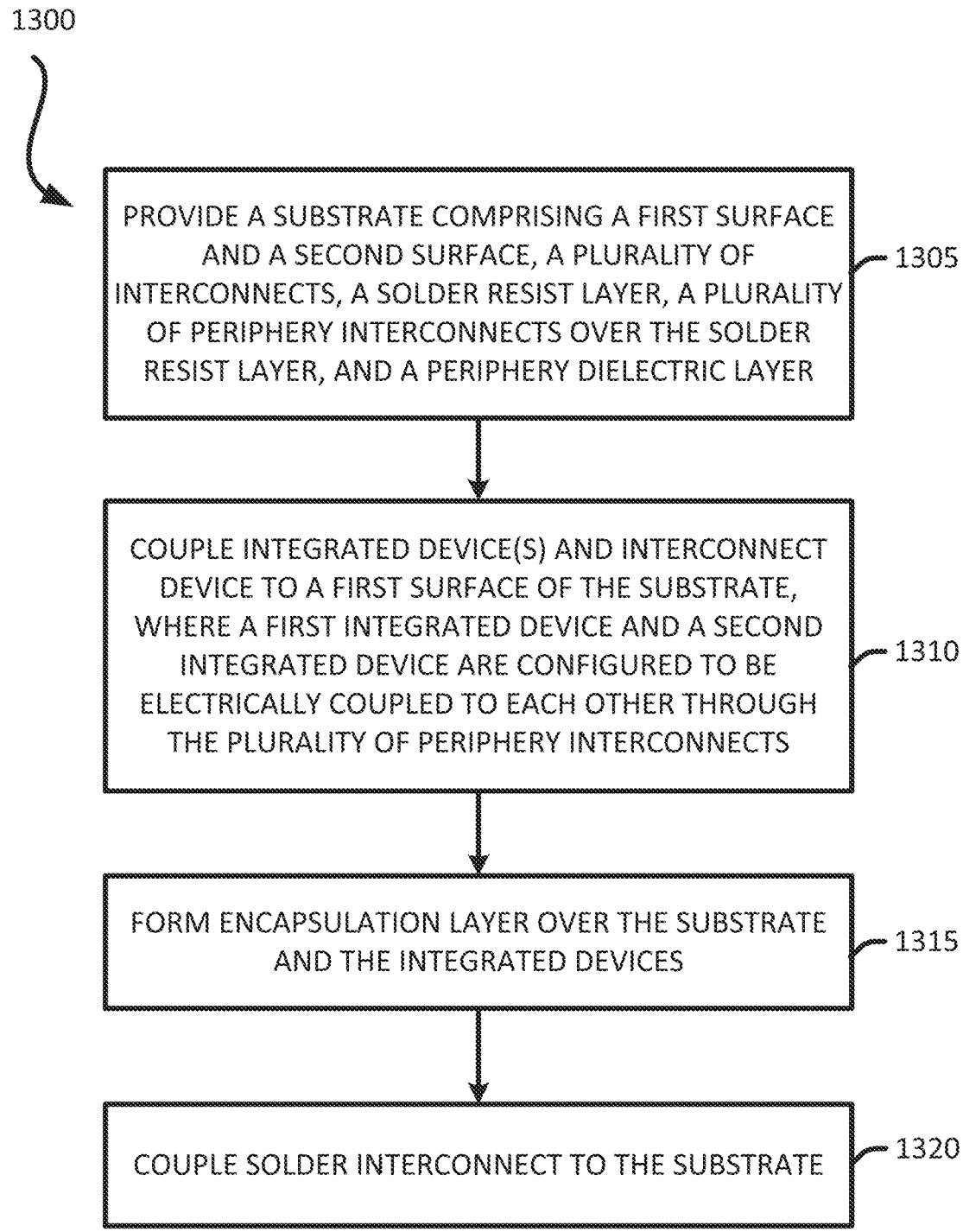
FIG. 13 illustrates an exemplary flow diagram of a method for fabricating a package that includes a substrate comprising periphery interconnects.

Exemplary Flow Diagram of a Method for Fabricating a Package that Includes a Substrate Comprising Periphery Interconnects In some implementations, fabricating a package that includes a substrate comprising periphery interconnects includes several processes. FIG. 13 illustrates an exemplary flow diagram of a method 1300 for providing or fabricating a package that includes a substrate comprising periphery interconnects. In some implementations, the method 1300 of FIG. 13 may be used to provide or fabricate the package 600 of FIG. 6 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes a substrate comprising periphery interconnects. In some implementations, the order of the processes may be changed or modified.

The method provides (at 1305) a substrate (e.g., 202) with periphery interconnects. The substrate 202 may be provided by a supplier or fabricated. The substrate 202 includes a first surface and a second surface. The substrate 202 includes at least one dielectric layer 620, a plurality of interconnects 622, a solder resist layer 401, a solder resist layer 601, a plurality of periphery interconnects 635, and a periphery dielectric layer 403. Different implementations may provide different substrates. A process similar to the processes shown in FIGS. 8 and 10A-10C may be used to fabricate the substrate 202. However, different implementations may use different processes to fabricate the substrate 202. Stage 1 of FIG. 12A illustrates and describes an example of providing a substrate with periphery interconnects.

The method couples (at 1310) a plurality of integrated devices (e.g., 201, 203, 205) and/or component(s) (e.g., 607) to the first surface of the substrate (e.g., 202). For example, the integrated device 203 may be coupled to the substrate 202 through the plurality of solder interconnects 630. The plurality of solder interconnects 630 may be coupled to interconnects from the plurality of interconnects 622 of the substrate 202. In another example, the integrated device 205 may be coupled to the substrate 202 through the plurality of solder interconnects 650. The plurality of solder interconnects 650 may be coupled to interconnects from the plurality of interconnects 622 of the substrate 202. The integrated device 203 and the integrated device 205 may be coupled to the substrate such that the integrated device 203 and the integrated device 205 are configured to be electrically coupled to each other through the plurality of periphery interconnects 635. The plurality of periphery interconnects 635 may be located at least partially along a boundary of the routing region 204 and the keep out region 206 of the substrate 202. Stage 2 of FIG. 12A illustrates and describes an example of integrated devices and components coupled to a substrate. Coupling the integrated device to the substrate may also include providing an underfill (e.g., 613, 633, 653) between a respective integrated device (e.g., 203, 205) and the substrate 202. Stage 2 of FIG. 12A illustrates and describes an example of an underfill being provided.

The method forms (at 1315) an encapsulation layer (e.g., 610) over the substrate (e.g., 202). The encapsulation layer 610 may include a mold, a resin and/or an epoxy. A compression molding process, a transfer molding process, or a liquid molding process may be used to form the encapsulation layer 610. The encapsulation layer 610 may be photo etchable. The encapsulation layer 610 may be a means for encapsulation. The encapsulation layer may encapsulate the integrated devices(s) and/or the components. Stage 3 of FIG. 12B illustrates and describes an example of forming an encapsulation layer over a substrate.

The method couples (at 1320) a plurality of solder interconnects (e.g., 380) to the second surface of the substrate (e.g., 202). Stage 4 of FIG. 12B, illustrates and describes an example of coupling solder interconnects to the substrate.

Exemplary Electronic Devices

Figure 14:
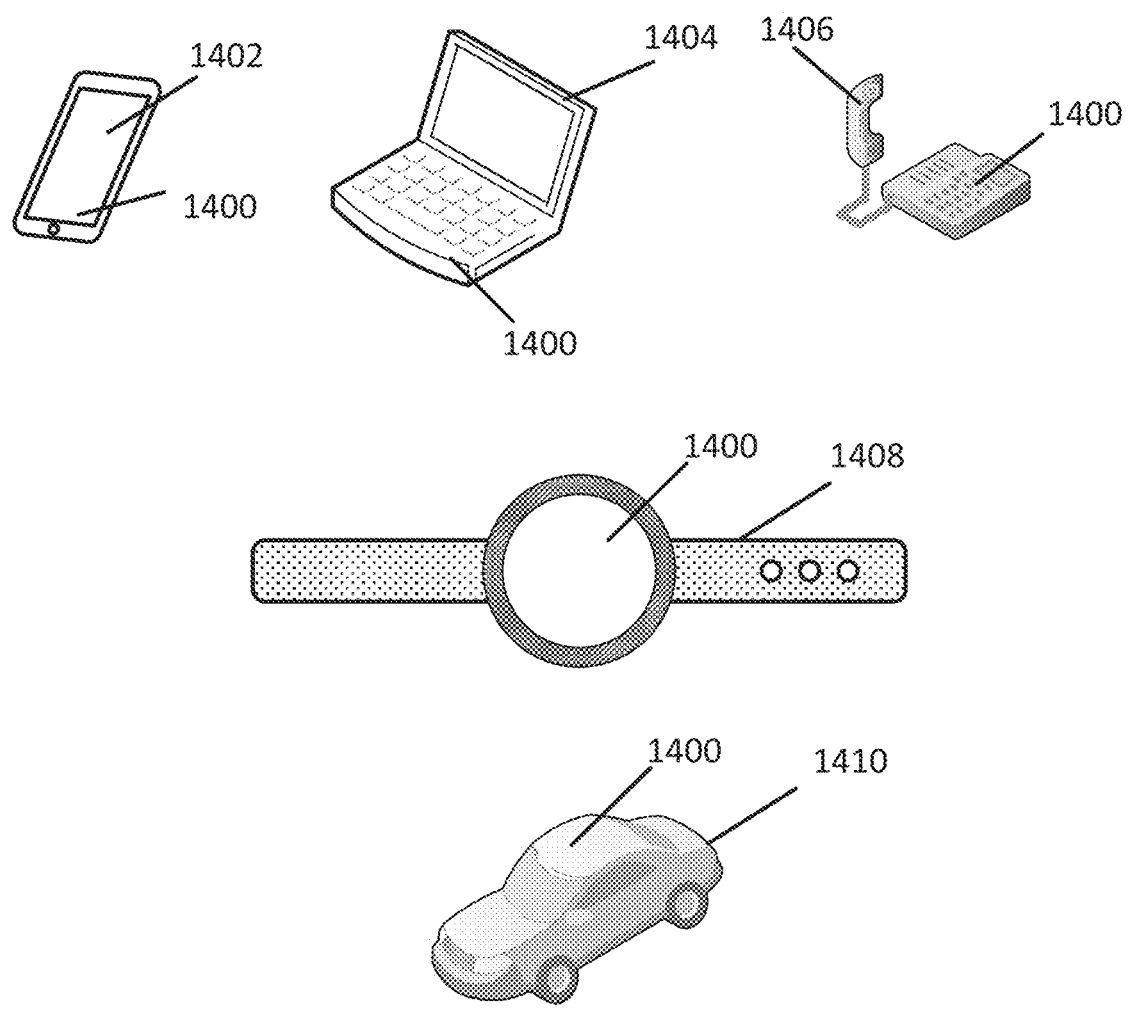
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-9, 10A-10C, 11, 12A-12B, and/or 13-14 may be rearranged and/or combined into a single component, process, feature or function or embodied in several components, processes, or functions. Additional elements, components, processes, and/or functions may also be added without departing from the disclosure. It should also be noted FIGS. 2-9, 10A-10C, 11, 12A-12B, and/or 13-14 and its corresponding description in the present disclosure is not limited to dies and/or ICs. In some implementations, FIGS. 2-9, 10A-10C, 11, 12A-12B, and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate, a first integrated device and a second integrated device. The substrate comprising at least one dielectric layer; a plurality of interconnects; a solder resist layer; and a plurality of periphery interconnects located over the solder resist layer. The first integrated device is coupled to the substrate. The second integrated device is coupled to the substrate, wherein the second integrated devices is configured to be electrically coupled to the first integrated device through the plurality of periphery interconnects.

Aspect 2: The package of aspect 1, wherein the substrate includes a routing region and a keep out region, and wherein the plurality of periphery interconnects is located at least partially along a boundary of the routing region and the keep out region.

Aspect 3: The package of aspect 2, wherein the keep out region is a region of the substrate that is free of interconnects.

Aspect 4: The package of aspects 1 through 3, wherein the plurality of periphery interconnects is configured to provide at least one electrical path for at least one signal between the first integrated device and the second integrated device.

Aspect 5: The package of aspects 1 through 4, wherein the first integrated device includes a first power management integrated device and/or a first application processor.

Aspect 6: The package of aspect 5, wherein the second integrated device includes a second power management integrated device and/or a second application processor.

Aspect 7: The package of aspects 1 through 6, further comprising a periphery dielectric layer located over the solder resist layer and the plurality of periphery interconnects.

Aspect 8: The package of aspects 1 through 7, further comprising a third integrated device coupled to the substrate, wherein the substrate further includes a second plurality of periphery interconnects located over the solder resist layer, wherein the substrate further includes a third plurality of periphery interconnects located over the solder resist layer, wherein the first integrated device is configured to be electrically coupled to the third integrated device through the second plurality of periphery interconnects, and wherein the second integrated device is configured to be electrically coupled to the third integrated device through the third plurality of periphery interconnects.

Aspect 9: The package of aspects 1 through 8, wherein the plurality of periphery interconnects, the second plurality of periphery interconnects, and the third plurality of periphery interconnects are located along a periphery of the substrate.

Aspect 10: The package of aspects 1 through 9, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: An apparatus comprising a substrate, a first integrated device and a second integrated device. The substrate comprising at least one dielectric layer; a plurality of interconnects; a solder resist layer; and means for periphery interconnection located over the solder resist layer. The first integrated device is coupled to the substrate. The second integrated device is coupled to the substrate, wherein the second integrated devices is configured to be electrically coupled to the first integrated device through the means for periphery interconnection.

Aspect 12: The apparatus of aspect 11, wherein the substrate includes a routing region and a keep out region, and wherein the means for periphery interconnection is located at least partially along a boundary of the routing region and the keep out region.

Aspect 13: The apparatus of aspect 12, wherein the keep out region is a region of the substrate that is free of interconnects.

Aspect 14: The apparatus of aspects 11 through 13, wherein the means for periphery interconnection is configured to provide at least one electrical path for at least one signal between the first integrated device and the second integrated device.

Aspect 15: The apparatus of aspects 11 through 14, wherein the first integrated device includes a first power management integrated device and/or a first application processor.

Aspect 16: The apparatus of aspect 15, wherein the second integrated device includes a second power management integrated device and/or a second application processor.

Aspect 17: The apparatus of aspects 11 through 16, further comprising a periphery dielectric layer located over the solder resist layer and the means for periphery interconnection.

Aspect 18: A method for fabricating a package. The method provides a substrate comprising at least one dielectric layer; a plurality of interconnects; a solder resist layer; and a plurality of periphery interconnects located over the solder resist layer. The method couples a first integrated device to the substrate. The method couples a second integrated device to the substrate, wherein the second integrated devices is configured to be electrically coupled to the first integrated device through the plurality of periphery interconnects.

Aspect 19: The method of aspect 18, wherein the substrate includes a routing region and a keep out region, and wherein the plurality of periphery interconnects is located at least partially along a boundary of the routing region and the keep out region.

Aspect 20: The method of aspect 19, wherein the keep out region is a region of the substrate that is free of interconnects.

Aspect 21: The method of aspects 18 through 20, wherein the plurality of periphery interconnects is configured to provide at least one electrical path for at least one signal between the first integrated device and the second integrated device.

Aspect 22: The method of aspects 18 through 21, wherein the first integrated device includes a first power management integrated device and/or a first application processor.

Aspect 23: The method of aspects 18 through 22, further comprising a periphery dielectric layer located over the solder resist layer and the plurality of periphery interconnects.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
at least one dielectric layer;
a plurality of interconnects;
a solder resist layer; and
a plurality of periphery interconnects located over the solder resist layer;
a first integrated device coupled to the substrate; and
a second integrated device coupled to the substrate, wherein the second integrated devices is configured to be electrically coupled to the first integrated device through the plurality of periphery interconnects.

2. The package of claim 1,
wherein the substrate includes a routing region and a keep out region, and
wherein the plurality of periphery interconnects is located at least partially along a boundary of the routing region and the keep out region.

3. The package of claim 2, wherein the keep out region is a region of the substrate that is free of interconnects.

4. The package of claim 1, wherein the plurality of periphery interconnects is configured to provide at least one electrical path for at least one signal between the first integrated device and the second integrated device.

5. The package of claim 1, wherein the first integrated device includes a first power management integrated device and/or a first application processor.

6. The package of claim 5, wherein the second integrated device includes a second power management integrated device and/or a second application processor.

7. The package of claim 1, further comprising a periphery dielectric layer located over the solder resist layer and the plurality of periphery interconnects,
wherein the plurality of periphery interconnects are located between the solder resist layer and the periphery dielectric layer, and
wherein the plurality of periphery interconnects touches the solder resist layer and the periphery dielectric layer.

8. The package of claim 1, further comprising a third integrated device coupled to the substrate,
wherein the substrate further includes a second plurality of periphery interconnects located over the solder resist layer,
wherein the substrate further includes a third plurality of periphery interconnects located over the solder resist layer,
wherein the first integrated device is configured to be electrically coupled to the third integrated device through the second plurality of periphery interconnects, and
wherein the second integrated device is configured to be electrically coupled to the third integrated device through the third plurality of periphery interconnects.

9. The package of claim 1, wherein the plurality of periphery interconnects, the second plurality of periphery interconnects, and the third plurality of periphery interconnects are located along a periphery of the substrate.

10. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An apparatus comprising:
a substrate comprising:
at least one dielectric layer;
a plurality of interconnects;
a solder resist layer; and
means for periphery interconnection located over the solder resist layer;
a first integrated device coupled to the substrate; and
a second integrated device coupled to the substrate, wherein the second integrated devices is configured to be electrically coupled to the first integrated device through the means for periphery interconnection.

12. The apparatus of claim 11,
wherein the substrate includes a routing region and a keep out region, and
wherein the means for periphery interconnection is located at least partially along a boundary of the routing region and the keep out region.

13. The apparatus of claim 12, wherein the keep out region is a region of the substrate that is free of interconnects.

14. The apparatus of claim 11, wherein the means for periphery interconnection is configured to provide at least one electrical path for at least one signal between the first integrated device and the second integrated device.

15. The apparatus of claim 11, wherein the first integrated device includes a first power management integrated device and/or a first application processor.

16. The apparatus of claim 15, wherein the second integrated device includes a second power management integrated device and/or a second application processor.

17. The apparatus of claim 11, further comprising a periphery dielectric layer located over the solder resist layer and the means for periphery interconnection
wherein the means for periphery interconnection is located between the solder resist layer and the periphery dielectric layer, and
wherein the means for periphery interconnection touches with the solder resist layer and the periphery dielectric layer.

18. A method for fabricating a package, comprising:
providing a substrate comprising:
- at least one dielectric layer;
- a plurality of interconnects;
- a solder resist layer; and
- a plurality of periphery interconnects located over the solder resist layer;

coupling a first integrated device to the substrate; and
coupling a second integrated device to the substrate, wherein the second integrated devices is configured to be electrically coupled to the first integrated device through the plurality of periphery interconnects.

19. The method of claim 18,
wherein the substrate includes a routing region and a keep out region, and
wherein the plurality of periphery interconnects is located at least partially along a boundary of the routing region and the keep out region.

20. The method of claim 19, wherein the keep out region is a region of the substrate that is free of interconnects.

21. The method of claim 18, wherein the plurality of periphery interconnects is configured to provide at least one electrical path for at least one signal between the first integrated device and the second integrated device.

22. The method of claim 18, further comprising a periphery dielectric layer located over the solder resist layer and the plurality of periphery interconnects.

23. The apparatus of claim 11, further comprising a third integrated device coupled to the substrate,
wherein means for periphery interconnection comprises:
- a first plurality of periphery interconnects located over the solder resist layer;
- a second plurality of periphery interconnects located over the solder resist layer; and
- a third plurality of periphery interconnects located over the solder resist layer, wherein the first plurality of periphery interconnects, the second plurality of periphery interconnects and the third plurality of periphery interconnects touch the solder resist layer, wherein the second integrated devices is configured to be electrically coupled to the first integrated device through the first plurality of periphery interconnects, wherein the first integrated device is configured to be electrically coupled to the third integrated device through the second plurality of periphery interconnects, and wherein the second integrated device is configured to be electrically coupled to the third integrated device through the third plurality of periphery interconnects.

* * * * *